United States Patent [19]

Bowers

[11] Patent Number: 4,583,051
[45] Date of Patent: Apr. 15, 1986

[54] EXTENDED RANGE AMPLIFIER CIRCUIT
[75] Inventor: Derek F. Bowers, Sunnyvale, Calif.
[73] Assignee: Precision Monolithics, Inc., Santa Clara, Calif.
[21] Appl. No.: 668,721
[22] Filed: Nov. 6, 1984
[51] Int. Cl.[4] .......................... H03F 3/04; H03K 17/00
[52] U.S. Cl. .................................. 330/296; 330/110; 307/300
[58] Field of Search .............. 330/100, 110, 290, 296, 330/151; 307/300, 549

[56] References Cited
U.S. PATENT DOCUMENTS
4,109,166 8/1978 Clark, Jr. et al. ................... 330/110

Primary Examiner—James B. Mullins
Assistant Examiner—G. Wan
Attorney, Agent, or Firm—Koppel & Harris

[57] ABSTRACT

An output circuit amplifier has first and second stage amplifying transistors with an impedance circuit connected between the base of the first stage transistor and the collector-emitter circuit of the second stage transistor to draw current from the first stage transistor base, thereby keeping both transistors out of saturation. The impedance circuit establishes a voltage drop between the two transistors such that large output voltage swings are enabled at an output terminal connected to the second stage transistor. The collector-emitter circuit of the first stage transistor is connected directly to a positive voltage bus to avoid further saturation problems.

23 Claims, 4 Drawing Figures

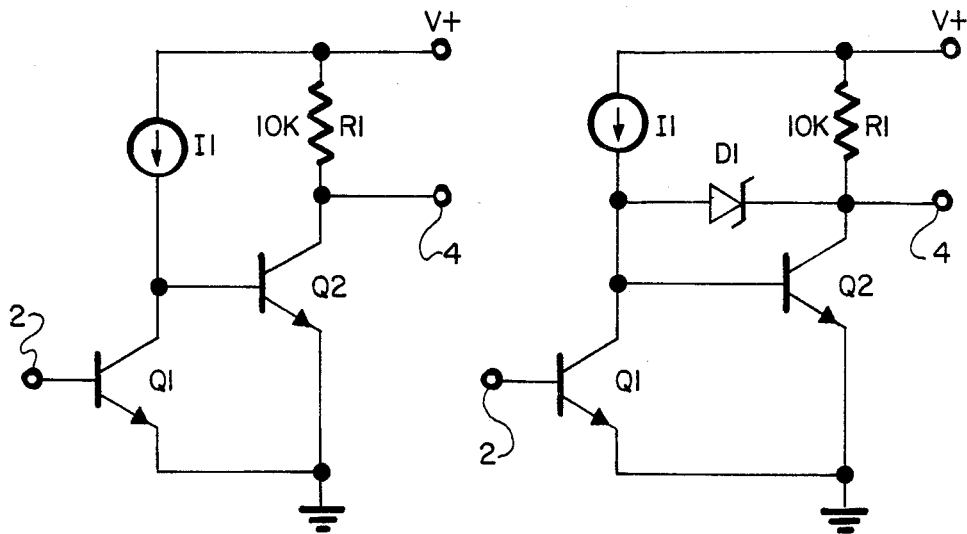
Fig.1. (PRIOR ART)
Fig.2. (PRIOR ART)
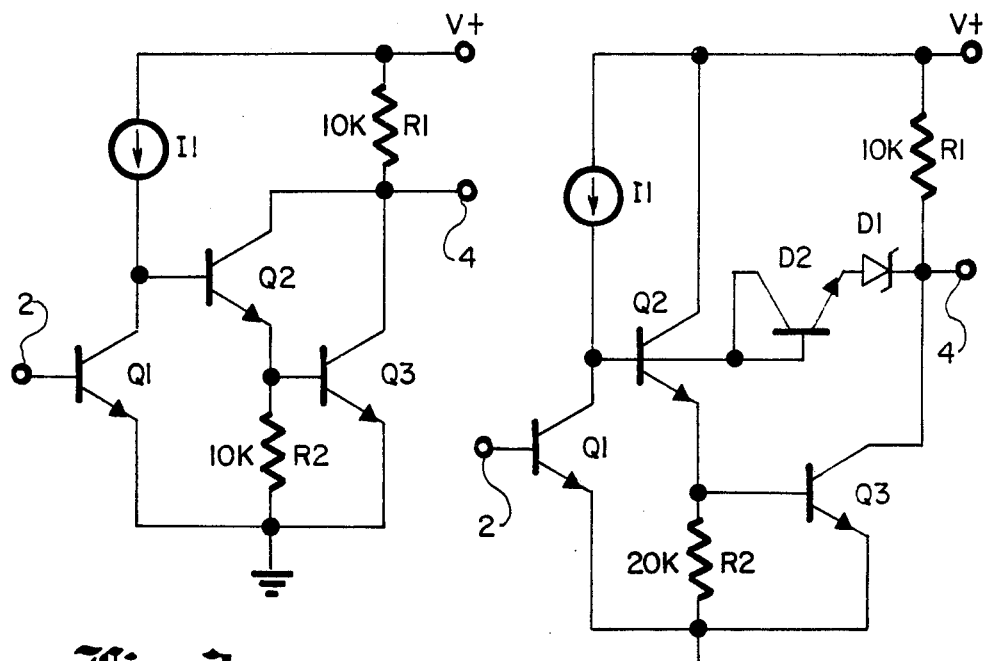
Fig.3. (PRIOR ART)
Fig.4.

EXTENDED RANGE AMPLIFIER CIRCUIT

BACKGROUND OF THE INVENTION

1. Field of the Invention

This invention relates to integrated circuit amplifiers, and more particularly to amplifiers which are employed as the output stage of another circuit.

2. Description of the Prior Art

Various amplifier circuits have been used as the output stage of comparators and other circuit devices. These amplifiers have generally been incapable of obtaining a desirable combination of high current gain, wide operating range and fast response time.

A simple output amplifier stage employed in the prior art is shown in FIG. 1. In this circuit the output from a previous stage is delivered to an input terminal 2 which is connected to the base of transistor Q1. A current source I1 supplies current from a positive voltage bus V+ through the collector-emitter circuit of Q1 to ground potential, and also to the base of another transistor Q2. The collector of Q2 is connected through a resistor R1 to V+, and also feeds an output terminal 4; the emitter of Q2 is grounded. R1 is typically an external resistor supplied by the user.

The circuit of FIG. 1 provides a single stage of amplification, with the output current at terminal 4 limited to the current gain of Q2 (Beta) times I1. It has a relatively slow response time because of saturation problems associated with Q2.

FIG. 2 illustrates another prior art circuit which solves the saturation problems of the FIG. 1 circuit, and can therefore operate at a higher speed. Its basic limitation is that its output current is still limited to Beta times I1. The FIG. 2 circuit, commonly referred to as a "Schottky clamped output stage", adds to the circuitry of FIG. 1 a Schottky-barrier diode D1 which is connected between the collector of Q1 and the junction between the collector of Q2 and output terminal 4, the diode being oriented to conduct current toward the junction. A Schottky-barrier diode, also known as a hot-carrier or a surface-barrier diode, consists of a rectifying metal-to-semiconductor contact rather than an npn junction. When properly fabricated, such a rectifying contact minimizes charge-storage effects and increases diode switching speed by shortening turn-off time. Schottky-barrier diodes exhibit a smaller forward voltage drop for low current levels than do standard junction diodes, typically in the range of 400-450 mV for Schottky-barrier diodes as opposed to 650-700 mV for standard junction diodes.

Except for the addition of the Schottky-barrier diode, the prior art FIG. 2 circuit is identical to that of FIG. 1. While the Schottky-barrier diode diverts enough current from the base of Q2 to keep it from saturating, and thereby increases the operating speed of the circuit, the output current is still limited to Beta times I1, as noted above.

A third popular output amplifier stage, commonly referred to as a direct-coupled Darlington amplifier, is illustrated in FIG. 3. In this circuit a second amplifying stage, consisting of transistor Q3 with its collector connected to the collector of Q2, its base connected to the emitter of Q2 and its emitter grounded, is used. A resistor R2 may be connected between the base of Q3 and ground. This circuit produces a significantly greater amplification, with the output current in the order of (Beta)$^2$ times I1. However, the operating range of the circuit is limited, since Q2 will saturate if the output voltage swings close enough to ground so that the Q3 base voltage exceeds its collector voltage.

SUMMARY OF THE INVENTION

In view of the above problems associated with the prior art, the object of the present invention is the provision of a novel and improved integrated circuit amplifier stage which attains a high degree of amplification, avoids the transistor saturation problems encountered in the prior art, and has an extended output voltage range.

In the accomplishment of these and other objects, a two-stage output amplifier is provided with first and second stage amplifying transistors. An impedance circuit is connected between the base of the first stage transistor and a junction between the output terminal and the collector-emitter circuit of the second stage transistor. The impedance circuit draws sufficient current from the base of the first stage transistor to keep it out of saturation, and keeps the second stage transistor operative by establishing a voltage drop that is less than the cumulative base-emitter voltages of the two transistors. The circuit achieves a high degree of amplification comparable to that of the prior art Darlington stage illustrated in FIG. 3, but has a greater output range and avoids its saturation problems, thereby improving response time.

These and other features and advantages of the invention will be apparent to those skilled in the art from the following detailed description of a preferred embodiment, taken together with the accompanying drawings, in which:

DESCRIPTION OF THE DRAWINGS

FIGS. 1-3 are schematic diagrams of prior art output amplifier stages;

FIG. 4 is a schematic diagram of an output amplifier utilizing the present invention.

DESCRIPTION OF A PREFERRED EMBODIMENT

An embodiment of the invention utilizing npn amplifying transistors is shown in FIG. 4. It should be understood that pnp transistors could also be used, in which case the circuit could be altered in a conventional manner to accommodate the reversed polarity and produce an equivalent operation. The circuit has several elements which are structurally comparable to corresponding elements employed in the prior art circuits of FIGS. 1-3 (although some of the elements do not have an equivalent operation within the overall design of the FIG. 4 circuit), and such elements are identified by the same reference numerals as employed in FIGS. 1-3.

In a manner similar to the FIG. 3 Darlington amplifier circuit, current source I1 directs current to the collector of Q1 and the base of Q2. The base of Q1 receives a signal from input terminal 2, which input signal controls the input signal at the base of Q2. Transistor Q3 is connected as an emitter follower to Q2, and its collector is connected to output terminal 4 and through resistor R1 to V+.

The remainder of the circuitry, however, is quite different from the prior art and results in the desired increased output range, reduction in saturation problems and corresponding faster response time. An impedance circuit is connected between the base of Q2 and the junction between output terminal 4 and the collector of Q3. The impedance circuit preferably comprises a Schottky-barrier diode D1 connected in series with a conventional junction diode D2 (integrated circuit diodes are typically formed by shorting together the base and collector of a bipolar transistor). The impedance circuit serves the dual purpose of drawing off sufficient current from the base of Q2 to prevent that transistor from saturating at higher speeds, and also of preventing Q2 from delivering excessive base current to Q3, thereby keeping that transistor out of saturation.

The impedance circuit could be formed from other impedance elements, such as a simple resistor, but in that case its response time would be much slower than with the junction and Schottky-barrier diode combination shown in FIG. 4. The impedance circuit should be selected so that its voltage drop is less than the voltage differential between the collector and emitter of Q3, thereby keeping that transistor operative. In FIG. 4 the base-emitter voltage drops of Q2 and Q3 are each approximately 700 mV. Since the voltage drop across D2 is also approximately 700 mV and the voltage drop across the Schottky-barrier diode D1 is approximately 450 mV, the voltage requirement is satisfied. However, since the Q2 base voltage will be maintained at a minimum level approximately 1.4 volts above ground potential (the cumulative base-emitter voltages of Q2 and Q3), the output voltage on terminal 4 can swing no lower than 1.4 volts less the voltage drop across the impedance circuit. Thus, while the upper limit of the voltage drop across the impedance circuit is fixed as described above, it is desirable that the actual voltage drop be relatively high compared to this upper limit, and preferably greater than one-half of the maximum voltage drop. The combination of junction diode D2 and Schottky-barrier diode D1 satisfies this condition, and permits the output load voltage to swing to within approximately 200 or 250 mV of ground potential, thus providing an extended output voltage range.

The collector of Q2 is connected directly to V+, rather than to the output terminal as in the prior art circuits. With the circuit of FIG. 4, connecting the collector of Q2 to the output terminal would result in Q2 becoming saturated for low output voltage swings. Tying it directly to V+ in accordance with the invention prevents this saturation problem.

The present amplifier circuit obtains an extended output voltage range while avoiding the saturation problems encountered in the prior art, and thus improving response time, and in addition achieves a high degree of amplification. Numerous modifications and variations on the particular circuit shown will occur to those skilled in the art. For example, while the transistor emitters have been shown referenced to ground potential, some other reference voltage level could be used so long as an appropriate voltage differential was maintained between the two voltage buses. Accordingly, it is intended that the invention be limited only in terms of the appended claims.

I claim:

1. A two-stage integrated circuit amplifier, comprising:
    an output terminal,
    first and second voltage busses, the first bus adapted to carry a higher voltage than the second bus,
    a first stage npn transistor having its collector connected to the first voltage bus and its base connected to receive an input current to be amplified,
    a second stage npn transistor having its base connected to the emitter of the first stage transistor, its emitter connected to the second voltage bus and its collector connected to the output terminal, and
    an impedance circuit connected between the base of the first stage transistor and the collector of the second stage transistor to draw sufficient current from the base of the first stage transistor to keep it out of saturation, said impedance circuit establishing a voltage drop between the base of the first stage transistor and the collector of the second stage transistor which is less than the cumulative base-emitter voltages of the first and second stage transistors.

2. The amplifier of claim 1, said impedance circuit comprising a diode circuit.

3. The amplifier of claim 2, said diode circuit comprising a Schottky-barrier diode and a junction diode connected in series.

4. The amplifier of claim 1, said impedance circuit establishing a voltage drop greater than half the cumulative base-emitter voltages of the first and second stage transistors.

5. The amplifier of claim 1, the second voltage bus adapted to be maintained at ground potential.

6. The amplifier of claim 5, further comprising a first resistor connected between the ground bus and the junction between the first stage transistor emitter and the second stage transistor base.

7. The amplifier of claim 6, further comprising a second resistor connected between the output terminal and the higher voltage bus.

8. A two-stage integrated circuit amplifier, comprising:
    an output terminal,
    first and second voltage busses, the first bus adapted to carry a higher voltage than the second bus,
    a first stage bipolar transistor having its collector-emitter circuit connected between the voltage busses and its base connected to receive an input current,
    a second stage transistor having its collector-emitter circuit connected between the output terminal and the second voltage bus, and its base connected to the collector-emitter circuit of the first stage transistor, and
    an impedance circuit connected between the output terminal and base of the first stage transistor to control that transistor's base current and keep it out of saturation, said impedance circuit establishing a voltage drop which is less than the voltage differential across the collector-emitter circuit of the second stage transistor.

9. The amplifier of claim 8, said impedance circuit comprising a diode circuit.

10. The amplifier of claim 9, said diode circuit comprising a Schottky-barrier diode and a junction diode connected in series.

11. The amplifier of claim 8, said impedance circuit establishing a voltage drop which is greater than half the voltage differential across the collector-emitter circuit of the second stage transistor.

12. The amplifier of claim 8, the second voltage bus adapted to be maintained at ground potential.

13. An integrated circuit amplifier circuit, comprising:
    an input terminal,
    an output terminal, first and second voltage busses, the first bus adapted to carry a higher voltage than the second bus, a current source, first, second and third npn transistors, each transistor having a base, collector and emitter, the first transistor having its base connected to the input terminal, its collector connected to receive current from the current source, and its emitter connected in circuit with the second voltage bus, the second transistor having its base connected in common with the collector of the first transistor, its collector connected to the first voltage bus, and its emitter connected to the base of the third transistor, said third transistor having its collector connected to the output terminal and its emitter connected in circuit with the second voltage bus, and an impedance circuit connected between the base of the second transistor and the collector of the third transistor to draw sufficient current from the base of the second transistor to keep it out of saturation; said impedance circuit establishing a voltage drop between the base of the second transistor and the collector of the third transistor which is less than the cumulative base-emitter voltages of the second and third transistors.

14. The amplifier circuit of claim 13, said impedance circuit comprising a diode circuit.

15. The amplifier circuit of claim 14, said diode circuit comprising a Schottky-barrier diode and a junction diode connected in series.

16. The amplifier circuit of claim 13, said impedance circuit establishing a voltage drop which is greater than half the cumulative base-emitter voltages of the second and third transistors.

17. The amplifier circuit of claim 13, the second voltage bus adapted to be maintained at ground potential.

18. The amplifier circuit of claim 17, further comprising a first resistor connected between the ground bus and the junction between the second transistor emitter and the third transistor base.

19. The amplifier circuit of claim 18, further comprising a second resistor connected between the output terminal and the higher voltage bus.

20. An integrated circuit amplifier circuit, comprising:

an input terminal, an output terminal, first and second voltage busses, first, second and third bipolar transistors, each transistor having a base, collector and emitter, the base of the first transistor connected to the input terminal, the collector-emitter circuit of the second transistor connected between the voltage busses and to the base of the third transistor, and the collector-emitter circuit of the third transistor connected between the output terminal and one of the voltage busses, a current source connected to supply current to the collector-emitter circuit of the first transistor and to the base of the second transistor, and an impedance circuit connected to the base of the second transistor to control that transistor's base current and keep it out of saturation.

21. The amplifier circuit of claim 20, said impedance circuit being connected between the second transistor base and the output terminal.

22. The amplifier circuit of claim 21, said impedance circuit comprising a diode circuit.

23. The amplifier circuit of claim 22, said diode circuit comprising a Schottky-barrier diode and a junction diode connected in series.

* * * * *